(12) United States Patent
Rasheed et al.

(10) Patent No.: US 9,087,679 B2
(45) Date of Patent: Jul. 21, 2015

(54) UNIFORMITY TUNING CAPABLE ESC GROUNDING KIT FOR RF PVD CHAMBER

(75) Inventors: Muhammad M. Rasheed, San Jose, CA (US); Rongjun Wang, Dublin, CA (US); Thanh X. Nguyen, San Jose, CA (US); Alan A. Ritchie, Menlo Park, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 549 days.

(21) Appl. No.: 13/365,876

(22) Filed: Feb. 3, 2012

(65) Prior Publication Data

US 2012/0211354 A1 Aug. 23, 2012

Related U.S. Application Data

(60) Provisional application No. 61/441,186, filed on Feb. 9, 2011.

(51) Int. Cl.
*C23C 14/34* (2006.01)
*H01J 37/34* (2006.01)
*H01J 37/32* (2006.01)

(52) U.S. Cl.
CPC ........... *H01J 37/34* (2013.01); *H01J 37/32082* (2013.01); *H01J 37/3441* (2013.01)

(58) Field of Classification Search
CPC ..... C23C 14/06; C23C 14/35; H01J 37/3208; H01J 37/34; H01J 37/3441; H01J 37/3447; H01L 21/203; H01L 21/28; H01L 21/31
USPC .............. 204/192.12, 298.06, 298.11, 298.14
See application file for complete search history.

(56) References Cited

U.S. PATENT DOCUMENTS

| | | | |
|---|---|---|---|
| 3,661,758 A * | 5/1972 | Jackson et al. | 204/298.14 |
| 4,897,172 A * | 1/1990 | Katsura et al. | 204/298.06 |
| 6,221,221 B1 * | 4/2001 | Al-Shaikh et al. | 204/298.02 |
| 6,837,968 B2 | 1/2005 | Brown et al. | |
| 7,713,390 B2 | 5/2010 | Golubovsky | |
| 2003/0029568 A1 | 2/2003 | Brown et al. | |
| 2008/0023318 A1 | 1/2008 | Kuroiwa | |
| 2008/0230518 A1 | 9/2008 | Brillhart et al. | |
| 2008/0274291 A1 * | 11/2008 | Shooshtari | 427/389.8 |
| 2010/0252417 A1 | 10/2010 | Allen et al. | |
| 2011/0036709 A1 | 2/2011 | Hawrylchak et al. | |
| 2011/0089023 A1 * | 4/2011 | Tanaka et al. | 204/192.12 |
| 2011/0240464 A1 | 10/2011 | Rasheed et al. | |

FOREIGN PATENT DOCUMENTS

JP 2002-356771 * 12/2002

OTHER PUBLICATIONS

Machine Translation JP 2002-356771 dated Dec. 2002.*
PCT international search report and written opinion of PCT/US2012/023762 dated Aug. 30, 2012.

* cited by examiner

*Primary Examiner* — Rodney McDonald
(74) *Attorney, Agent, or Firm* — Patterson & Sheridan, LLP

(57) ABSTRACT

Embodiments of the invention generally relate to a grounding kit for a semiconductor processing chamber, and a semiconductor processing chamber having a grounding kit. More specifically, embodiments described herein relate to a grounding kit which creates an asymmetric grounding path selected to significantly reduce the asymmetries caused by an off center RF power delivery.

20 Claims, 7 Drawing Sheets

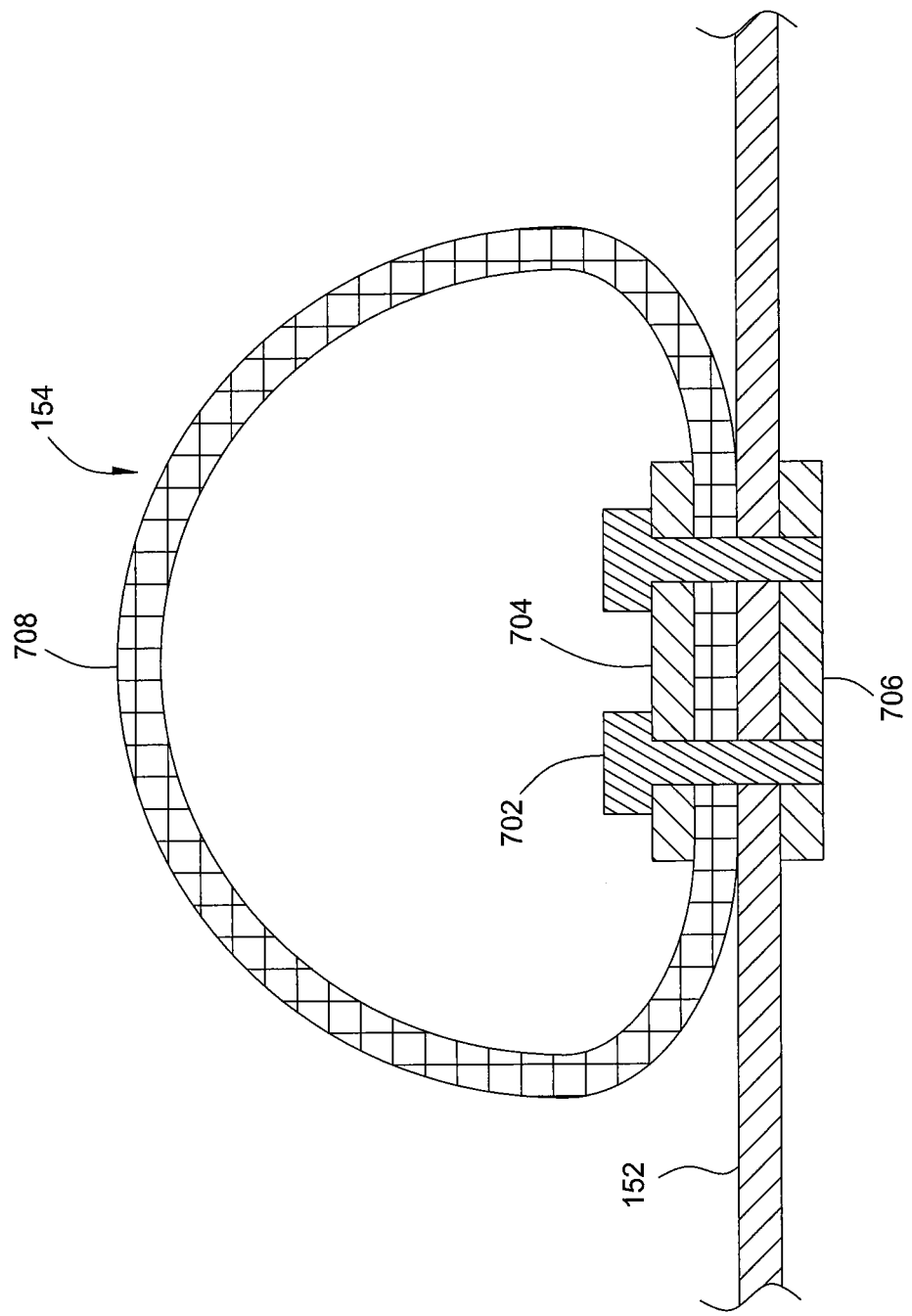

UNIFORMITY TUNING CAPABLE ESC GROUNDING KIT FOR RF PVD CHAMBER

CROSS-REFERENCE TO RELATED APPLICATION

This application claims benefit of U.S. Provisional Application Ser. No. 61/441,186, filed Feb. 9, 2011, which is incorporated by reference in its entirety.

BACKGROUND OF THE INVENTION

1. Field of the Invention

Embodiments of the invention generally relate to a grounding kit for a semiconductor processing chamber, and a semiconductor processing chamber having a grounding kit. More specifically, embodiments of the invention relate to a grounding kit capable of producing a uniform plasma in a physical vapor deposition chamber having asymmetrical RF power delivery.

2. Description of the Related Art

Physical vapor deposition (PVD), or sputtering, is one of the most commonly used processes in the fabrication of electronic devices. PVD is a plasma process performed in a vacuum chamber where a negatively biased target is exposed to a plasma of an inert gas having relatively heavy atoms (e.g., argon (Ar)) or a gas mixture comprising such inert gas. Bombardment of the target by ions of the inert gas results in ejection of atoms of the target material. The ejected atoms accumulate as a deposited film on a substrate placed on a substrate support pedestal disposed within the chamber. The support pedestal usually includes an electrostatic chuck (ESC) to support and retain substrates within the processing chamber during processing.

A grounding kit may be disposed in the chamber to create a return path for the RF power, which is used to create the plasma, to travel back to the RF power source. Due to process chamber complexity and size constraints, not all of the chamber components can be coaxially aligned with the substrate support pedestal. This offset of components can cause uniformity issues in the plasma created within the chamber. For instance, it has been found by the inventors that using a conventional grounding kit in a chamber having an offset RF power delivery site can cause the RF power to be distributed asymmetrically, especially at RF power frequencies greater than 13.56 MHz. Thus, the plasma created is distributed asymmetrically across the substrate being processed which can cause the substrate to be processed unevenly.

Although conventional grounding kit designs have a robust processing history at 13.56 MHz of RF power, processes performed using conventional kits at higher frequencies exhibit asymmetries beyond desirable limits. Therefore, there is a need in the art for an improved grounding kit.

SUMMARY OF THE INVENTION

Embodiments of the invention generally provide a grounding kit for use in a physical vapor deposition (PVD) chamber and a PVD chamber having a grounding kit.

In one embodiment, a grounding kit is provided for use in a substrate processing chamber. The substrate processing chamber has a target disposed thereon and an RF power source operable to provide RF power at frequencies greater than 13.56 MHz to the target in a manner that produces an RF power delivery asymmetry. The processing chamber also includes a substrate support electrically coupled thereto and a shield surrounding the target and the substrate support. The shield is selectively electrically coupled to the substrate support when the substrate support is in an elevated position. The grounding kit has a plurality of conductors electrically coupling the shield to the substrate support and selectively positioned to compensate for the power delivery asymmetry by providing an asymmetrical grounding path between the shield and the substrate support.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 7 is a sectional view of one embodiment of a ground path contact.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the invention generally provide a process kit for use in a physical deposition (PVD) chamber. In one embodiment, the process kit has reduced effects on the electric fields within the process cavity, which promotes greater process uniformity and repeatability.

Figure 1:
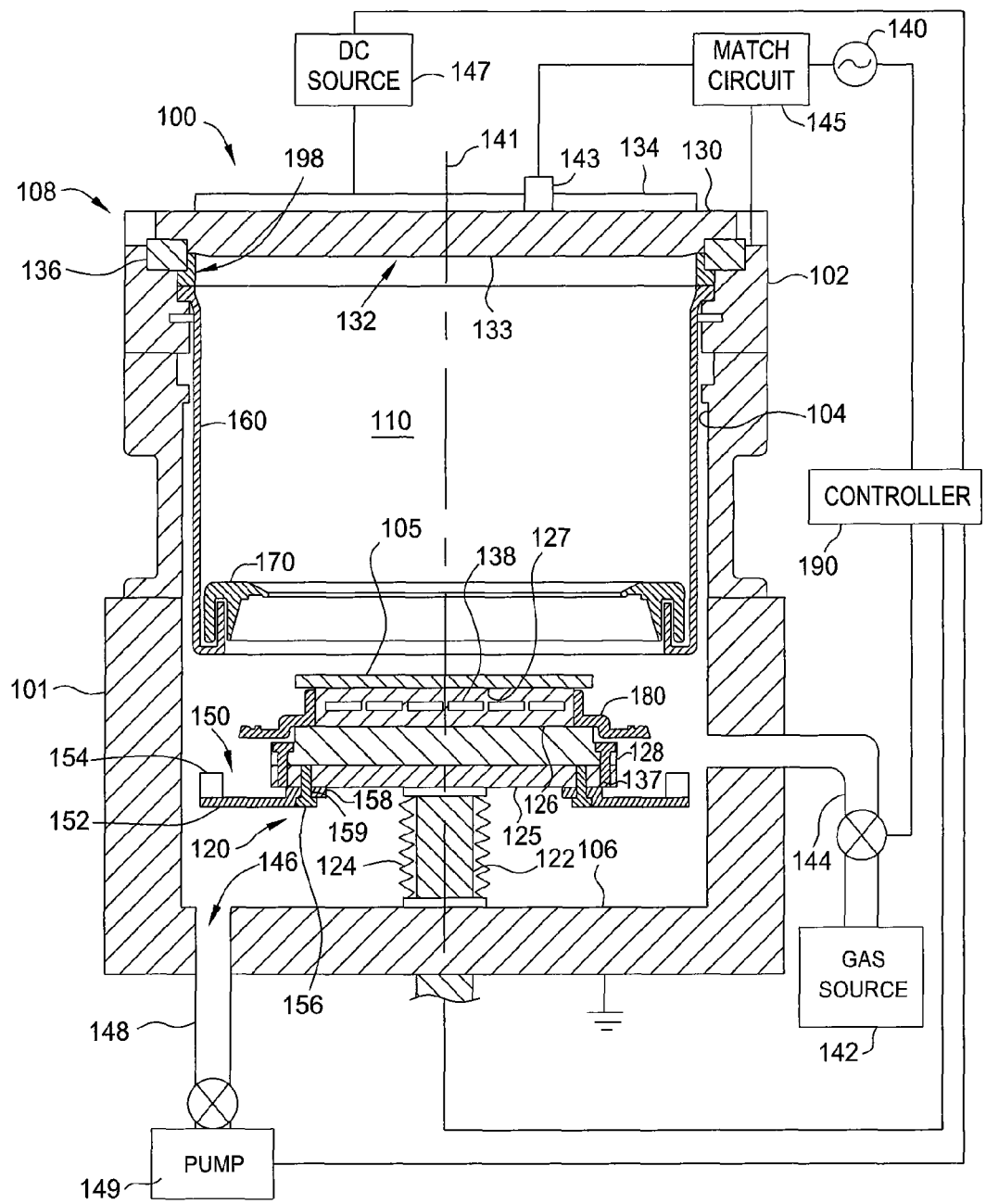
FIG. 1 is a simplified cross-sectional view of a semiconductor processing system having one embodiment of a grounding kit.

FIG. 1 depicts an exemplary semiconductor processing chamber 100 having one embodiment of a grounding kit 150. In the embodiment shown, the processing chamber 100 comprises a sputtering chamber, also called a physical vapor deposition (PVD) chamber, capable of depositing metal or ceramic materials, such as for example, Si, SiN, Er, Yb, Y, Hf, HfO, Ru, Co, AlN, Ti, TiAl, TiN, AlO, Al, Cu, Ta, TaN, TaC, W, WN, La, LaO, Ni, a nickel alloy, such as NiPt, NiTi, or NiYb, among others. One example of a processing chamber that may be adapted to benefit from the invention is the ALPS® Plus and SIP ENCORE® PVD processing chambers, available from Applied Materials, Inc. of Santa Clara, Calif. It is contemplated that other processing chambers including those from other manufacturers may be adapted to benefit from the invention.

The processing chamber 100 includes a chamber body 101 having upper adapters 102 and sidewall adapters 104, a chamber bottom 106, and a lid assembly 108 that enclose an interior volume 110 or plasma zone. The chamber body 101 is typically fabricated by machining and welding plates of stainless steel or by machining a single mass of aluminum. In one embodiment, the sidewall adapters 104 comprise aluminum and the chamber bottom 106 comprises stainless steel. The chamber bottom 106 generally contains a slit valve (not shown) to provide for entry and egress of a substrate 105 from the processing chamber 100.

The lid assembly 108 generally includes a target backing plate 130, a target 132, and a magnetron 134. The target backing plate 130 is supported by the upper adapters 102 when in a closed position. A ceramic ring seal 136 is disposed between the target backing plate 130 and upper adapters 102 to prevent vacuum leakage therebetween.

The target 132 is coupled to the target backing plate 130 and exposed to the interior volume 110 of the processing chamber 100. The target 132 provides material which is deposited on the substrate 105 during a PVD process. The target 132 may contain Si, SiN, Er, Yb, Y, Hf, HfO, Ru, Co, AlN, Ti, TiAl, TiN, AlO, Al, Cu, Ta, TaN, TaC, W, WN, La, LaO, Ni, a nickel alloy, such as NiPt, NiTi, or NiYb, or other suitable material. An isolator ring 198 is disposed between the target 132, target backing plate 130, and chamber body 101 to electrically isolate the target 132 from the target backing plate 130 and the upper adapter 102 of the chamber body 101.

A RF power source 140 and a DC power source 147 are coupled to the target 132 to provide a RF and/or DC bias thereto to drive the plasma process. The RF power source 140 is coupled by an RF feed terminal 143 to the target 132. The RF feed terminal 143 is offset from a centerline 141 of the target 132. The centerline 141 of the target 132 is also the centerline of the chamber 100. The target 132 may be biased relative to ground, e.g., the chamber body 101. The RF power source 140 and DC power source 147 may be positioned adjacent the chamber 100 and may be connected to the target 132 at off center locations in consideration for other chamber components which need to be centrally located. In one embodiment, the RF power source 140 provides power to the target 132 at a frequency greater than 13.56 MHz of power, for example at about 27.12 MHz or greater.

A gas, such as argon, is supplied to the interior volume 110 from a gas source 142 via conduits 144. The gas source 142 may comprise a non-reactive gas such as argon or xenon, which is capable of energetically impinging upon and sputtering material from the target 132. The gas source 142 may also include a reactive gas, such as one or more of an oxygen-containing gas, a nitrogen-containing gas, a methane-containing gas, that are capable of reacting with the sputtering material to form a layer on a substrate.

Spent process gas and byproducts are exhausted from the chamber 100 through exhaust ports 146 that receive spent process gas and direct the spent process gas to an exhaust conduit 148 having a throttle valve to control the pressure of the gas in the chamber 100. The exhaust conduit 148 is connected to one or more exhaust pumps 149. Typically, the pressure of the sputtering gas in the chamber 100 is set to sub-atmospheric levels, such as a vacuum environment, for example, gas pressures of 0.6 mTorr to 400 mTorr.

Figure 2:
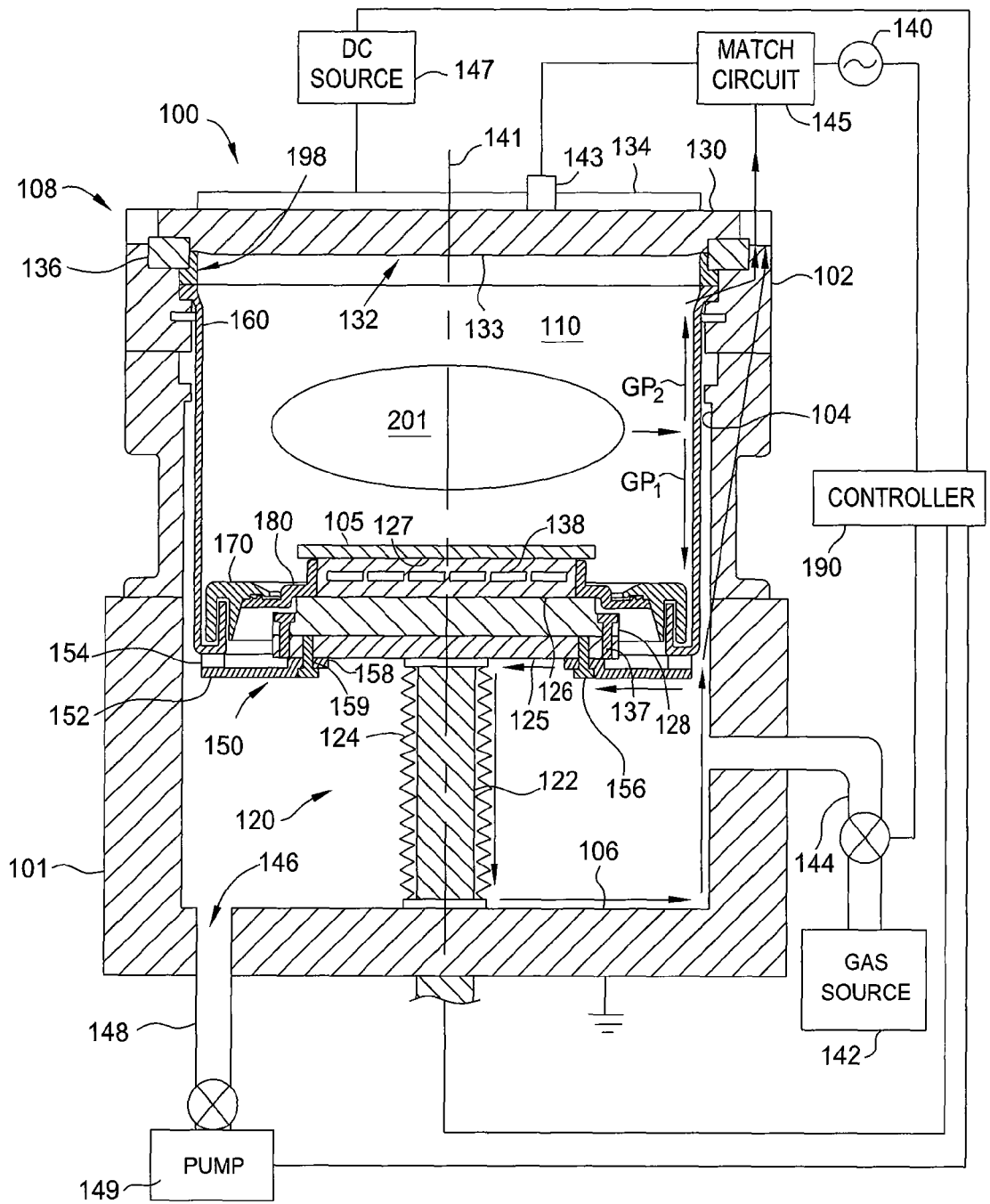
FIG. 2 is a simplified cross-sectional view of the semiconductor processing system of FIG. 1 during processing of a substrate.

A plasma is formed from the gas between the substrate 105 and the target 132, as seen in FIG. 2. Ions within the plasma are accelerated toward the target 132 and cause material to become dislodged from the target 132. The dislodged target material is deposited on the substrate 105. A match circuit 145 may be incorporated to compensate for fluctuations in the plasma during processing of the substrate 105.

The magnetron 134 is coupled to the target backing plate 130 on the exterior of the processing chamber 100. One magnetron which may be utilized is described in U.S. Pat. No. 5,953,827, issued Sep. 21, 1999 to Or et al., which is hereby incorporated by reference in its entirety.

A pedestal assembly 120 is supported by and electrically coupled to the chamber bottom 106. The pedestal assembly 120 supports the substrate 105 and the deposition ring 180 during processing. The pedestal assembly 120 is coupled to the chamber bottom 106 of the chamber 100 by a lift mechanism 122 that is configured to move the pedestal assembly 120 between a lower position as illustrated in FIG. 1 and an elevated position for processing as illustrated in FIG. 2. Additionally, in the lower position, lift pins (not shown) are moved through the pedestal assembly 120 to space the substrate from the pedestal assembly 120 to facilitate exchange of the substrate with a wafer transfer mechanism disposed exterior to the processing chamber 100, such as a single blade robot (not shown). A bellows 124 is typically disposed between the pedestal assembly 120 and the chamber bottom 106 to isolate the interior volume 110 of the chamber body 101 from the interior of the pedestal assembly 120 and the exterior of the chamber. The bellows is conductive to provide an electrical connection between the pedestal assembly 120 and the chamber body 101.

The pedestal assembly 120 generally includes a substrate support 126 sealingly coupled to a base plate 128 which is coupled to a ground plate 125. The substrate support 126 may be comprised of aluminum or ceramic. The substrate support 126 may be an electrostatic chuck, a ceramic body, a heater or a combination thereof. In one embodiment, the substrate support 126 is an electrostatic chuck that includes a dielectric body having electrodes 138 embedded therein. The ground plate 125 is typically fabricated from a metallic material such as stainless steel or aluminum. The base plate 128 may be coupled to the ground plate by a plurality of connectors 137. The connectors 137 may be one of a bolt, screw, rivet, weld or other suitable connector. The base plate 128 may be removable from the ground plate 125 for facilitating easier replacement and maintenance of the substrate support 126 and base plate 128. The substrate support 126 has a substrate receiving surface 127 that receives and supports the substrate 105 during processing, the surface 127 having a plane substantially parallel to a sputtering surface 133 of the target 132.

A ground shield 160, a cover ring 170, and a deposition ring 180 are used to confine a plasma 201 formed in the interior volume 110 to a region above the substrate 105, as seen in FIG. 2. The cover ring 170 interleaves with the ground shield 160 and cooperates with the deposition ring 180 to create pathways which prevent the plasma from leaving the interior volume 110.

The ground shield 160 is supported by the chamber body 101 and encircles the sputtering surface 133 of the sputtering target 132 that faces the substrate support 126. The shield 160 also surrounds the substrate support 126. The shield 160 covers and shadows the sidewall adapters 104 of the chamber 100 to reduce deposition of sputtering deposits originating from the sputtering surface 133 of the sputtering target 132 onto the components and surfaces behind the shield 160. For example, the shield 160 can protect the surfaces of the substrate support 126, the overhanging edge of the substrate 105, sidewall adapters 104 and chamber bottom 106 of the chamber 100.

The grounding kit 150 is used to provide a ground path for the RF and/or DC power delivered to the processing chamber 100. The grounding kit 150 includes at least a ground plate 152 and one or more ground path contacts 154. The ground plate 152 may be made of a highly conductive material, such as, for example, stainless steel. The ground plate 152 may be coupled to the ground plate 125 of the pedestal assembly 120 by a mounting ring 158. The mounting ring 158 may have a plurality of mounting holes 159 to allow connectors 156 to pass therethrough and couple to the ground plate 152 of the pedestal assembly 120. The connectors 156 may be one of a bolt, screw, rivet, weld or other suitable connector. The mounting ring 158 may be may be made of a highly conductive material, such as, for example, stainless steel, and in one embodiment, is formed with the ground plate 152 as a unitary body.

The ground path contacts 154 are adapted to contact a lower portion of the ground shield 160 thereby forming the ground path coupling the shield 160 to the pedestal assembly 120. The ground path contacts 154 may be made of a highly resilient and conductive material, such as, for example, beryllium copper or stainless steel. The ground path contacts 154 may have a spring form and may be adapted to compress when placed in contact with the ground shield 160 to ensure good electrical contact between the ground shield 160 and the pedestal assembly 120.

Processes performed in the chamber 100 are controlled by a controller 190 that comprises program code having instruction sets to operate components of the chamber 100 to facilitate processing of substrates in the chamber 100. For example, the controller 190 can comprise program code that includes a substrate positioning instruction set to operate the pedestal assembly 120; a gas flow control instruction set to operate gas flow control valves to set a flow of sputtering gas to the chamber 100; a gas pressure control instruction set to operate a throttle valve to maintain a pressure in the chamber 100; a temperature control instruction set to control a temperature control system (not shown) in the pedestal assembly 120 or sidewall adapter 104 to set temperatures of the substrate or sidewall adapters 104, respectively; and a process monitoring instruction set to monitor the process in the chamber 100.

Referring now to FIG. 2, in operation, RF power at a frequency greater than 13.56 MHz, for example at about 27.12 MHz or greater, is delivered from the RF power source 140 through the match circuit 145 to the sputtering target 132. The RF power is coupled to the gases within the interior volume 110 to form the plasma 201 therein. The RF current is coupled from the plasma 201 to the ground shield 160, and travels along a first ground path $GP_1$ and a second ground path $GP_2$ back to the match circuit 145. The grounding kit 150 is part of the first ground path $GP_1$. The first and second ground paths $GP_1$, $GP_2$ work in concert to maintain the plasma 201 at a substantially central location between the sputtering target 132 and substrate 105 within the interior volume 110.

Figure 4:
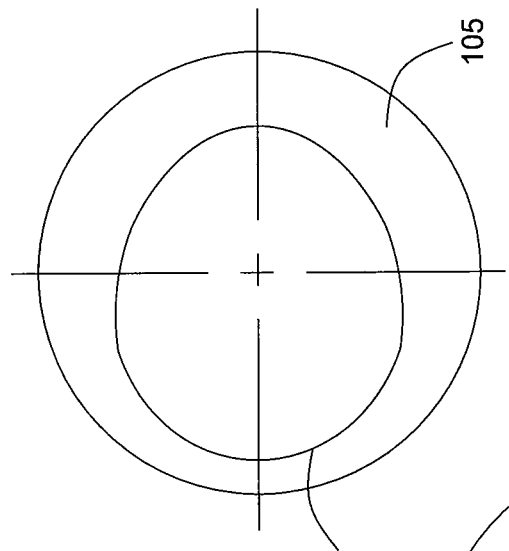
FIGS. 3-5 are illustrative plasma distributions under different RF circuit conditions.
Figure 5:
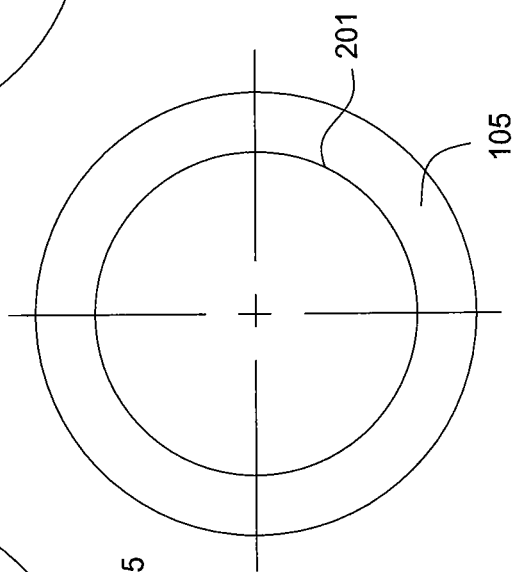
Figure 3:
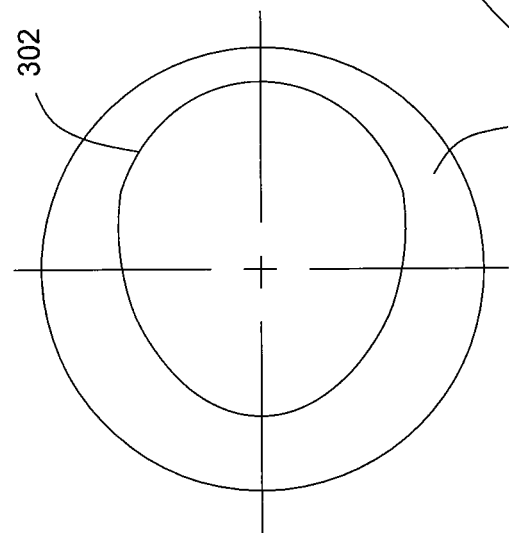

Referring now to FIGS. 3-5, FIG. 3 is an illustrative distribution of plasma 302, shown above the substrate 105, formed using an off center RF power delivery and a symmetric ground return path. The off center RF power delivery may provide power to the interior volume 110 of the chamber 100 asymmetrically at RF frequencies above 13.56 MHz, for example about 27.12 MHz or greater, thereby causing an asymmetric distribution of plasma 302 above the substrate 105. It has been found by the inventors that the use of an asymmetric ground path can be used to compensate for the off-set distribution of the plasma 302.

FIG. 4 is an illustrative distribution of plasma 402 formed using a centered RF power delivery and an asymmetric ground path created by a non-symmetrical azimuthal distribution of contacts 154 relative to the centerline of the chamber body 101 and ground shield 160. Even though the RF power is delivered symmetrically above the center of the substrate 105, the asymmetric ground path causes the plasma to distribute asymmetrically around the substrate 105, with a larger distribution near the portion of the ground path that has more contact area (i.e., more current carrying capacity) resulting from a greater number of contacts 154 in that region. The portion of the ground path having more current carrying capacity can be tuned by repositioning the contact 154 such that the asymmetry caused by an off center RF power delivery is substantially canceled out by the asymmetry caused by the ground path. For example, the distribution of the plasma 402 shown in FIG. 4, which is created by the asymmetric ground path, is tuned to be a mirror image of the distribution of the plasma 302 shown in FIG. 3.

Combining the off center RF power delivery with the tuned asymmetric ground path causes the plasma to become evenly distributed across the substrate 105, as shown in FIG. 5. For example, the plasma distribution may be azimuthally symmetrical to within 5 percent using an asymmetric grounding kit tuned for an offset delivery of power at a frequency of about 27.12 MHz of power delivery to the target 132.

The portion of the ground path with the most current carrying capacity is located opposite from the RF power delivery site across the center of the substrate. The ground path can be tuned by adjusting the specific amount of contact are to accurately compensate for the specific RF power delivery asymmetry using the position of the contacts 154, i.e., having more contacts 154 in one region or side of the substrate 105 or shield 160 relative the other. Determining the amount of contact area (i.e., contacts 154) needed in one region relative another can be done through computer modeling, empirical data, and trial and error, among other methods.

Figure 6A:
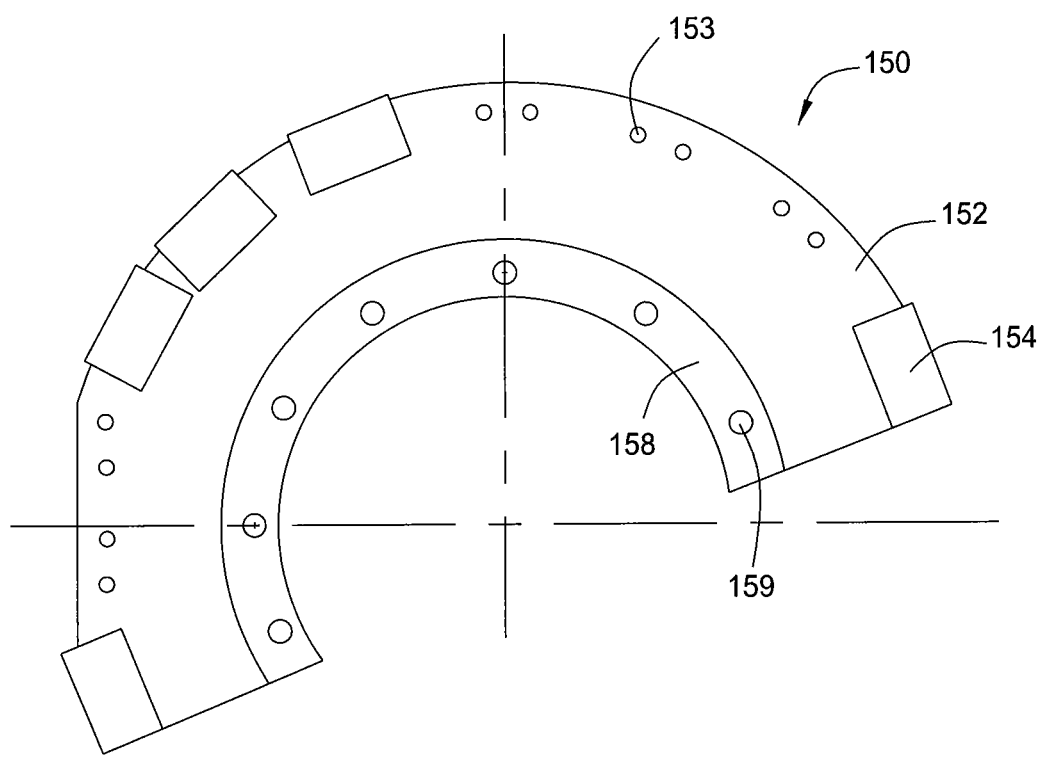
FIG. 6A is an overhead view of one embodiment of a grounding kit.
Figure 6B:
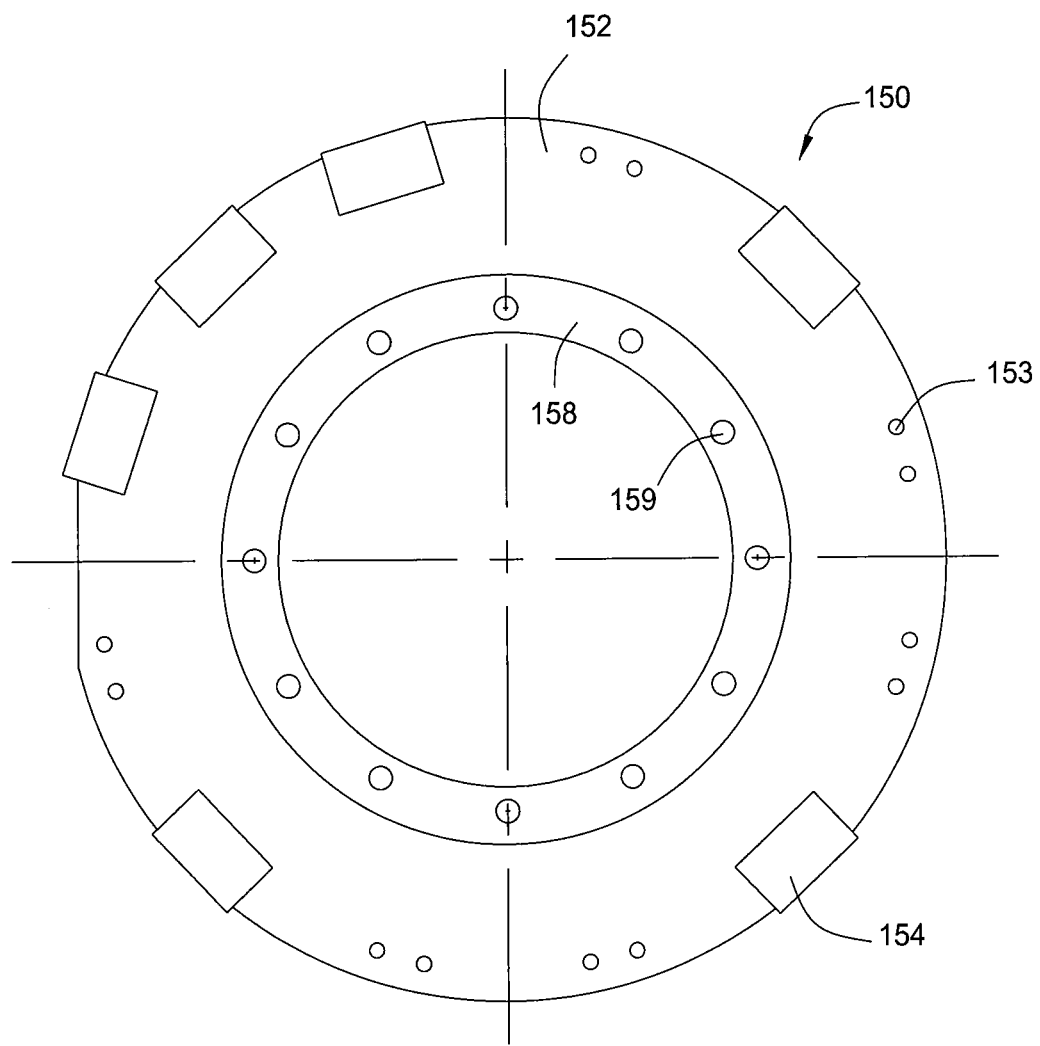
FIG. 6B is an overhead view of one embodiment of a grounding kit.

FIG. 6A is an overhead view of one embodiment of the grounding kit 150 which may be used to provide a tuned asymmetric grounding path to compensate for an off center RF power delivery. The grounding kit 150 has a plurality of ground path contacts 154 distributed asymmetrically along the perimeter of the ground plate 152. As discussed above, the ground path contacts 154 are located radially outward of the outermost diameter of the pedestal assembly 120 to provide sufficient clearance to allow the contacts 154 to interface with the ground shield 160. The ground plate 152 shown in FIG. 6A is configured to only partially surround the pedestal assembly 120 to allow space for other components of the processing chamber 100. However, the ground plate 152 may be configured to completely surround the pedestal assembly 120 if desired, as shown in FIG. 6B.

The ground plate 152 also has a plurality of holes 153 formed therethrough to facilitate fastening of the ground path contacts 154 to the ground plate 152. The holes 153 may be distributed in around the ground plate 152 to define mounting positions that allow the ground path contacts 154 to be selectively positioned around the pedestal assembly 120 to tune out the azimuthal asymmetry created by the offset RF power delivery or other condition. Depending on the number of holes 153 utilized to define a contact mounting position for coupling a single contact 154 to the ground plate 152, the ground plate 152 has at least N+1 contact mounting positions for number of contacts 154. In one embodiment, the holes 153 are located radially outward of the outermost diameter of the pedestal assembly 120 to provide sufficient clearance for the ground path contacts 154 to clear the pedestal assembly 120 to interface with the ground shield 160. The greater number of holes 153 allows the ground path contacts 154 to be repositionable on the ground plate 152 to allow the azuthmal symmetry of the ground path between the pedestal assembly 120 and shield 160 to be changed to match changes in the plasma symmetry do to the addition/replacement of chamber components and/or processing conditions.

FIG. 7 is a sectional view of one embodiment of a ground path contact 154 coupled to the ground plate 152. The ground path contact 154 is coupled to the ground plate 152 by one or more fasteners 702, for example two fasteners 702. The fasteners 702 may be one of a bolt, screw, rivet, weld or other suitable connector. In one embodiment, the fasteners 702 are bolts and pass through a first fastening plate 704 and threadingly engage with a second fastening plate 706. The fastening plates 704, 706 are positioned to clamp the ground path contact 154 and ground plate 152 together when the fasteners 702 are tightened. A contact point 708 may be adapted to contact the ground shield 160. The ground path contact 154 is adapted to compress when the pedestal assembly 120 is raised into the upper position for processing the substrate 105. The compressed ground path contact 154 generates a spring force that ensures good electrical contact between the ground path contact 154 and the ground shield 160. The height and/or width of the ground path contact 154 may be adjusted to tune the amount of contact between the ground path contact 154 and the ground shield 160. The ground path contact 154 may also be lengthened or shortened to further tune the amount of contact between the ground path contact and the ground shield 160.

Figure 8:
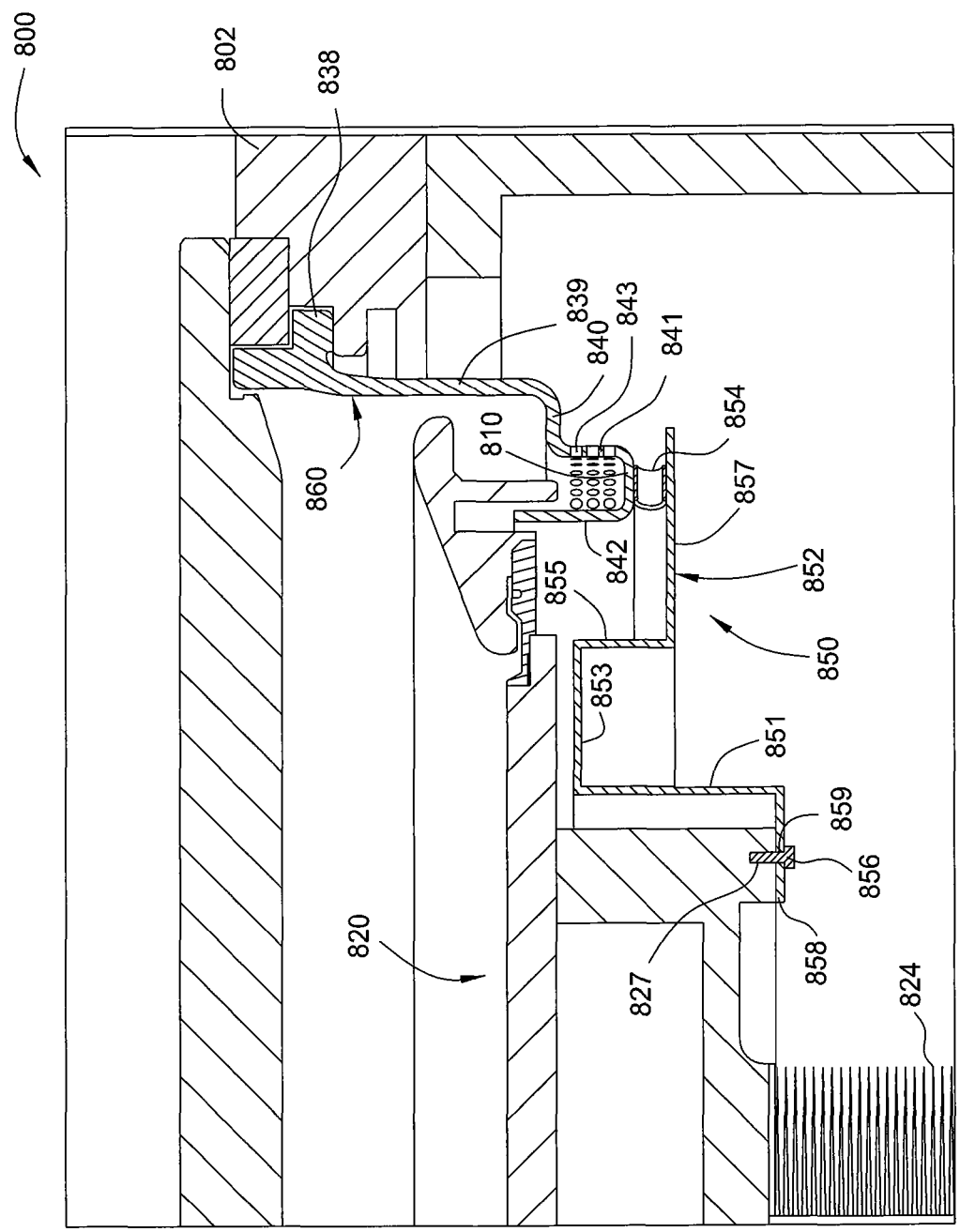
FIG. 8 is a partial sectional view of one embodiment of a contact ring assembly.

FIG. 8 illustrates a partial sectional view of one embodiment of a contact ring assembly 850. The contact ring assembly 850 is coupled to a substrate support assembly 820 disposed in a processing chamber 800. The substrate support assembly 820 is sealed to the chamber 800 by a bellows 824. The contact ring assembly 850 generally consists of a ring 852 mounted to the substrate support assembly 820 by a plurality of fasteners 856 disposed through mounting holes 859 of the ring 852 and threadingly engaged with threaded holes 827 of the substrate support assembly 820. The ring 852 comprises an attachment flange 858, an inner connecting wall 851, an upper ground plane member 853, an outer connecting wall 855, and a lower ground plane member 857. The upper ground plane member 853 and inner connecting wall 851 may be in close proximity with the substrate support assembly 820 to minimize arcing therebetween. Supported on the lower ground plane member 857 are a number of spring contacts 854 adapted to contact a ground shield 860 thereby creating a ground path for energy provided to the chamber 800 to be returned to the energy source. The spring contacts 854 may be positioned on the lower ground plane member 857 as described above to create an asymmetric ground path that may compensate for asymmetric RF power application. The spring contacts 854 may be made of a highly resilient and conductive material, such as, for example, beryllium copper or stainless steel. The spring contacts 854 may have a spring form and may be adapted to compress when placed in contact with the a bottom wall 810 of the ground shield 860 to ensure good electrical contact between the ground shield 860 and the substrate support assembly 820.

The ground shield may be supported on an upper adapter 802 of the chamber 800 by a mounting flange 838. The ground shield 860 generally consists of the mounting flange 838, an outer vertical wall 839, a step 840, a middle vertical wall 841, the bottom wall 810, and an inner vertical wall 842. The middle vertical wall 841 may have a plurality of apertures 843 formed therethrough. The apertures 843 accommodate high gas flow and do not allow plasma to flow therethrough.

Thus, a grounding kit has been provided that removes the asymmetries in a plasma caused by an off center RF power source.

While the foregoing is directed to embodiments of the present invention, other and further embodiments of the invention may be devised without departing from the basic scope thereof, and the scope thereof is determined by the claims that follow.

What is claimed is:

1. A processing chamber, comprising:
   a chamber body;
   a target disposed on the chamber body;
   an RF power feed coupled to the target in a position that produces an RF power delivery asymmetry;
   a substrate support electrically coupled the chamber body, the substrate support moveable between raised and lowered positions;
   a shield surrounding the target and the substrate support; and
   a grounding kit coupled to and moveable with the substrate support; the grounding kit having conductors positioned to provide an asymmetrical ground path between the shield and the substrate support when the substrate support is in the raised position and not to contact the shield when the substrate support is in the lowered position, the position of the conductors selected to compensate for the power delivery asymmetry.

2. The processing chamber of claim 1 further comprising:
   an RF power source coupled to the RF feed terminal and operable to provide RF power at a frequency greater than 13.56 MHz to the target.

3. The processing chamber of claim 2 further comprising:
   a DC power source coupled to the target.

4. The processing chamber of claim 1, the grounding kit comprising:
   a ground plate having N+1 or more contact mounting positions, wherein N is a number of contacts coupled to the ground plate.

5. The processing chamber of claim 1, wherein the target is selected from the group consisting of Si, SiN, Er, Yb, Y, Hf, HfO, Ru, Co, AlN, Ti, TiAl, TiN, AlO, Al, Cu, Ta, TaN, TaC, W, WN, La, LaO, Ni, and a nickel alloy.

6. The processing chamber of claim 1, wherein the grounding kit comprises:
   a ground plate coupled to the substrate support and having a plurality mounting locations; and
   a plurality of resilient conductive contacts coupled to the ground plate in a position radially outward of the substrate support and in an orientation that produces an asymmetrical ground path through the ground kit, wherein the number of contacts is less than the number of mounting locations.

7. The processing of claim 6, wherein the plurality of contacts are repositionable between the mounting locations.

8. The processing of claim 6, wherein the plurality of contacts are spring forms.

9. The processing of claim 6, wherein the plurality of contacts are fabricated from beryllium copper or stainless steel.

10. The processing of claim 6, wherein the ground plate is a segment of a ring.

11. A processing chamber, comprising:
    a chamber body;
    a target disposed on the chamber body;
    an RF feed terminal coupled to the target and configured to couple RF power provided from a power source to the target;
    a substrate support electrically coupled the chamber body, the substrate support moveable between raised and lowered positions;
    a shield surrounding the target and the substrate support; and a grounding kit having a non-symmetrical azimuthal distribution of repositionable conductive contacts configured to provide an asymmetrical ground path between the shield and the substrate support when the substrate support is in the raised position and not to contact the shield when the substrate support is in the lowered position.

12. The processing of claim 11, wherein the grounding kit comprises:
a ground plate coupled to the substrate support and having a plurality of conductive contact mounting locations, each mounting location configured to accept one of the conductive contacts in a position radially outward of the substrate support, wherein the number of contacts is less than the number of mounting locations.

13. The processing of claim 11, wherein the conductive contacts are spring forms.

14. The processing of claim 11, wherein the conductive contacts are fabricated from beryllium copper or stainless steel.

15. The processing of claim 12, wherein the ground plate is a segment of a ring.

16. The processing of claim 12, wherein the ground plate is a ring.

17. The processing chamber of claim 11 further comprising:
an RF power source coupled to the RF feed terminal and operable to provide RF power at a frequency greater than 13.56 MHz to the target.

18. The processing chamber of claim 11, wherein the RF feed terminal is positioned to provide RF power to the target in a location offset from a centerline of the target.

19. The processing chamber of claim 11, wherein the target is selected from the group consisting of Si, SiN, Er, Yb, Y, Hf, HfO, Ru, Co, AlN, Ti, TiAl, TiN, AlO, Al, Cu, Ta, TaN, TaC, W, WN, La, LaO, Ni, and a nickel alloy.

20. A method for processing a substrate, comprising:
establishing, by raising a substrate support, an asymmetric ground path between the substrate support and a ground shield through a plurality of repositional conductive contacts having a non-symmetrical azimuthal distribution around a periphery of the substrate support after a substrate is disposed on the substrate support, the asymmetric ground path substantially compensating for an asymmetrical plasma distribution;
delivering power at a frequency greater than 13.56 MHz to a target to cause material to be sputtered from the target;
depositing the sputtered material on a substrate, and
disconnecting, by lowering the substrate support, the asymmetric ground path between the substrate support and the ground shield.

* * * * *

UNITED STATES PATENT AND TRADEMARK OFFICE
CERTIFICATE OF CORRECTION

| | |
|---|---|
| PATENT NO. | : 9,087,679 B2 |
| APPLICATION NO. | : 13/365876 |
| DATED | : July 21, 2015 |
| INVENTOR(S) | : Rasheed et al. |

Page 1 of 1

It is certified that error appears in the above-identified patent and that said Letters Patent is hereby corrected as shown below:

Specification

In Detailed Description:

Column 6, Line 57, please insert -- N -- after for.

Signed and Sealed this
Twenty-ninth Day of December, 2015

Michelle K. Lee
*Director of the United States Patent and Trademark Office*